US009425270B2

(12) United States Patent
Liu et al.

(10) Patent No.: US 9,425,270 B2
(45) Date of Patent: Aug. 23, 2016

(54) ARRAY SUBSTRATE STRUCTURE AND CONTACT STRUCTURE

(71) Applicant: INNOLUX CORPORATION, Chu-Nan, Miao-Li County (TW)

(72) Inventors: Yu-Tsung Liu, Chu-Nan (TW); Chung-Wen Yen, Chu-Nan (TW)

(73) Assignee: INNOLUX CORPORATION, Jhu-Nan (TW)

( * ) Notice: Subject to any disclaimer, the term of this patent is extended or adjusted under 35 U.S.C. 154(b) by 0 days.

(21) Appl. No.: 14/519,646

(22) Filed: Oct. 21, 2014

(65) Prior Publication Data

US 2016/0049479 A1 Feb. 18, 2016

(30) Foreign Application Priority Data

Aug. 15, 2014 (TW) .............................. 103128044 A (51) Int. Cl.
| | | |
|---|---|---|
| H01L 27/12 | (2006.01) | |
| H01L 29/78 | (2006.01) | |
| H01L 23/52 | (2006.01) | |
| H01L 29/417 | (2006.01) | |
| H01L 29/786 | (2006.01) | |
| H01L 29/423 | (2006.01) | |
| H01L 23/522 | (2006.01) | |

(52) U.S. Cl.
CPC ..... *H01L 29/41733* (2013.01); *H01L 27/1222* (2013.01); *H01L 29/42384* (2013.01); *H01L 29/7869* (2013.01); *H01L 29/78666* (2013.01); *H01L 29/78675* (2013.01); *H01L 23/5226* (2013.01)

(58) Field of Classification Search
CPC .................................................. H01L 23/5226
See application file for complete search history.

(56) References Cited

U.S. PATENT DOCUMENTS

| | | | | |
|---|---|---|---|---|
| 5,940,732 | A * | 8/1999 | Zhang | H01L 21/31111 257/E21.251 |
| 6,362,865 | B2 * | 3/2002 | Yoshida | 349/122 |
| 6,509,215 | B2 * | 1/2003 | Fujikawa | H01L 27/124 257/59 |
| 8,283,788 | B2 * | 10/2012 | Zhang | H01L 21/31111 257/347 |
| 8,481,404 | B2 * | 7/2013 | Kammler | H01L 21/76229 257/E21.551 |
| 8,933,450 | B2 * | 1/2015 | Kim | H01L 27/3246 257/52 |
| 2003/0133059 | A1 * | 7/2003 | Wei | G02F 1/133555 349/113 |
| 2004/0119398 | A1 * | 6/2004 | Koo | H01L 51/5271 313/499 |
| 2005/0019994 | A1 * | 1/2005 | Chang | H01L 21/2026 438/166 |

(Continued)

FOREIGN PATENT DOCUMENTS

| | | |
|---|---|---|
| TW | 201248865 | 12/2012 |
| TW | 201322457 | 6/2013 |
| TW | 201403824 | 1/2014 |

*Primary Examiner* — Ida M Soward
(74) *Attorney, Agent, or Firm* — Liu & Liu (57) ABSTRACT

A contact structure is provided, including a substrate, an active layer, an inter-layer dielectric (ILD) layer, a contact opening, and a conductive layer. The active layer is disposed over the substrate, and the insulating layer is disposed over the active layer; an inter-layer dielectric (ILD) layer over the insulating layer. The contact opening penetrates a portion of the ILD layer and the insulating layer to expose a portion of the active layer, wherein the contact opening includes a first recess portion, and the first recess portion is defined by a bottom surface of the ILD layer, a sidewall of the insulating layer and a top surface of the active layer. The conductive layer is in the contact opening and is electrically connected to the active layer.

12 Claims, 9 Drawing Sheets

(56) References Cited

U.S. PATENT DOCUMENTS

| | | | | |
|---|---|---|---|---|
| 2005/0218819 A1* | 10/2005 | Eida | ................... | H01L 27/3248 315/169.3 |
| 2008/0061446 A1* | 3/2008 | You | ................... | H01L 21/76804 257/774 |
| 2008/0067519 A1* | 3/2008 | Sakurai | ............. | G02F 1/136213 257/72 |
| 2011/0117687 A1* | 5/2011 | Kim | ................... | H01L 27/3248 438/34 |
| 2011/0141425 A1* | 6/2011 | Moriya | ............... | G02F 1/13394 349/143 |
| 2011/0278578 A1* | 11/2011 | Yamazaki | ........... | H01L 27/3244 257/59 |
| 2012/0104397 A1* | 5/2012 | Choi | ................... | H01L 27/1255 257/59 |

* cited by examiner

ARRAY SUBSTRATE STRUCTURE AND CONTACT STRUCTURE

CROSS REFERENCE TO RELATED APPLICATIONS

This application claims priority of Taiwan Patent Application No. 103128044, filed on Aug. 15, 2014, the entirety of which is incorporated by reference herein.

BACKGROUND OF THE INVENTION

1. Field of the Invention

The present invention relates to display devices, and in particular to an array substrate structure and a contact structure for display devices.

2. Description of the Related Art

In order to fulfill the requirements of high-speed image processing and high-quality image displays, flat-panel displays, such as color liquid-crystal displays (LCDs) have become popular. LCDs typically have an upper and a lower substrate with electrodes thereon. These substrates are sealed with adhesive materials, and a liquid-crystal material is sealed between these two substrates. Prior to liquid-crystal injection, spacers are sprayed between the substrates in order to maintain a constant distance therebetween.

Thin film transistors (TFTs) are typically formed above the lower substrate as switching devices. Each TFT has a gate electrode connected to a scanning line, a drain electrode connected with a signal line, and a source electrode connected to a pixel electrode. The upper substrate is disposed above the lower substrate and includes a color filter and a plurality of light-shielding materials (e.g. resin black matrix). Edges of the lower and upper substrates are sealed with adhesive materials, and liquid-crystal materials are provided between the upper and lower substrates. The lower substrate is also called an array substrate, and elements such TFTs and electrical contacts are formed thereover, which are typically defined by performing several photolithography steps.

However, as improvements are made in the image resolution of display devices, element structures such as substrate structures and contact structures for maintaining or improving the electrical performance of display devices are needed, especially as the size of the elements such as TFTs and contacts formed over the lower substrate is further reduced.

BRIEF SUMMARY OF THE INVENTION

An exemplary contact structure comprises a substrate, an active layer, an insulating layer, an inter-layer dielectric layer (ILD), a contact opening, and a conductive layer. In one embodiment, the active layer is disposed over the substrate, and the insulating layer is disposed over the active layer. The inter-layer dielectric layer (ILD) is disposed over the insulating layer, and the contact opening penetrates a portion of the ILD layer and the insulating layer to expose a portion of the active layer, wherein the contact opening comprises a first recess portion and the first recess portion is defined by a bottom surface of the ILD layer, a sidewall of the insulating layer, and a top surface of the active layer. The conductive layer is in the contact opening to electrically connect with the active layer.

Another exemplary contact structure comprises a substrate, an insulating layer, an active layer, a first inter-layer dielectric (ILD) layer, a second inter-layer (ILD) dielectric layer, a contact opening, and a conductive layer. In one embodiment, the insulating layer is disposed over the substrate, and the active layer is disposed over a portion of the insulating layer. The first ILD layer is disposed over the active layer, and the second inter-layer dielectric layer (ILD) is disposed over the first ILD layer and the insulating layer. The contact opening penetrates a portion of the second ILD layer and the first ILD layer to expose a portion of the active layer, wherein the contact opening comprises a first recess portion and the first recess portion is defined by the bottom surface of the second ILD layer, a sidewall of the first ILD layer and the top surface of the active layer. The conductive layer is disposed in the contact opening to electrically connect with the active layer.

An exemplary array substrate structure comprises a substrate, an active layer, an insulating layer, a first conductive layer, an inter-layer dielectric layer, a contact opening, and a second conductive layer. In one embodiment, the active layer is disposed over a portion of the substrate, and the insulating layer is disposed over the active layer. The first conductive layer is disposed over the insulating layer, being disposed over a portion of the active layer, and the inter-layer dielectric layer (ILD) is disposed over the first conductive layer and the insulating layer. The contact opening penetrates a portion of the ILD layer and the insulating layer to exposes a portion of the active layer, wherein the contact opening comprises a first recess portion and the first recess portion is defined by a bottom surface of the ILD layer, a sidewall of the insulating layer and a top surface of the active layer. The second conductive layer is disposed in the contact opening to electrically connect with the active layer.

Another exemplary array substrate structure comprises a substrate, a first conductive layer, an insulating layer, an active layer, a first inter-layer dielectric (ILD) layer, a second inter-layer dielectric (ILD) layer, a contact opening, and a second conductive layer. In one embodiment, the first conductive layer is disposed over a portion of the substrate, and the insulating layer is disposed over the first conductive layer. The active layer is disposed over a portion of the insulating layer and the first conductive layer, and the first inter-layer dielectric layer (ILD) is disposed over the active layer. The second inter-layer dielectric layer (ILD) is disposed over the first ILD layer and the insulating layer, and the contact opening penetrates a portion of the second ILD layer and the first ILD layer to expose a portion of the active layer, wherein the contact opening comprises a first recess portion and the first recess portion is defined by a bottom surface of the second ILD layer, a sidewall of the first ILD layer and a top surface of the active layer. The second conductive layer is disposed in the contact opening to electrically connect with the active layer.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
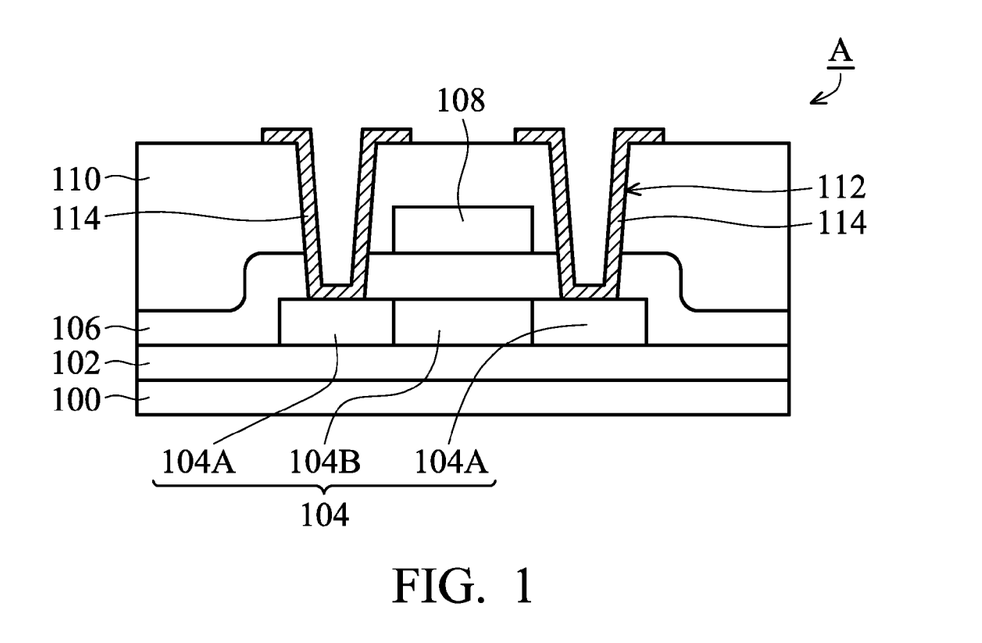
FIG. 1 is schematic cross-sectional view showing an array substrate structure according to an embodiment of the invention.

FIG. 1 is schematic cross-sectional view showing an exemplary array substrate structure A suitable for application in flat panel displays, such as color liquid-crystal displays (LCDs). Herein, the array substrate structure A is an array substrate structure known by the inventor for describing undesirable electrical performance such as increases of a contact resistance found by the inventors as the trend of size reduction of the elements, for example TFTs and conductive contacts, formed over the array substrate continues.

As shown in FIG. 1, the array substrate structure A mainly comprises a substrate 100, a buffer layer 102 disposed over the substrate 100, an active layer 104 disposed over a portion of the buffer layer 102, an insulating layer 106 disposed over the active layer 104 and the buffer layer 102, a conductive layer 108 disposed over the insulating layer 106 and over a portion of the active layer 104, an inter-layer dielectric (ILD) layer 110 disposed over the conductive layer 108 and the insulating layer 106, a contact opening 112 penetrating a portion of the ILD layer 110 and the insulating layer 106 and exposing a portion of the active layer 104, and another conductive layer 114 conformably disposed over a portion of the ILD layer 110 and over portions of the ILD layer 110, the insulating layer 102 and the active layer 104 exposed by the contact opening 112. In this embodiment, the conductive layer 108, the insulating layer 106 and the active layer 104 form a thin-film transistor (TFT). The active layer 104 may comprise semiconductor materials such as amorphous silicon, polysilicon or metal oxide. The active layer 104 comprises a pair of source/drain regions 104A doped with suitable dopants and an undoped channel region 104B formed between the source/drain regions 104A.

As shown in FIG. 1, the contact opening 112 is formed by an etching process such as dry etching, and the conductive layer 114 formed in the contact opening 112 may function as a conductive contact for electrically connecting one of the source/drain regions 104A with a sequentially formed conductive element (not shown).

However, as the trend of size reduction of the elements, for example TFTs and conductive contacts, formed over the array substrate structure A continues, a contact area between the conductive layer 114 as a conductive contact and a source/drain region 104A of the TFT will be reduced accordingly. Therefore, a contact resistance between the conductive layer 114 and the source/drain region 104A will be thus increased, thereby affecting electrically performance of the array substrate structure A.

Accordingly, a plurality of array substrate structures and contact structures are provided to maintain or further reduce the contact resistance between the conductive contact and the source/drain region of the TFT as the trend of size reduction of elements, for example TFTs and contact structures, formed over the array substrate structure continues, thereby maintaining or even improving related electrical performance of the array substrate structure.

FIGS. 2A-2D are schematic cross-sectional views showing a method for fabricating an exemplary array substrate structure B.

Figure 2A:
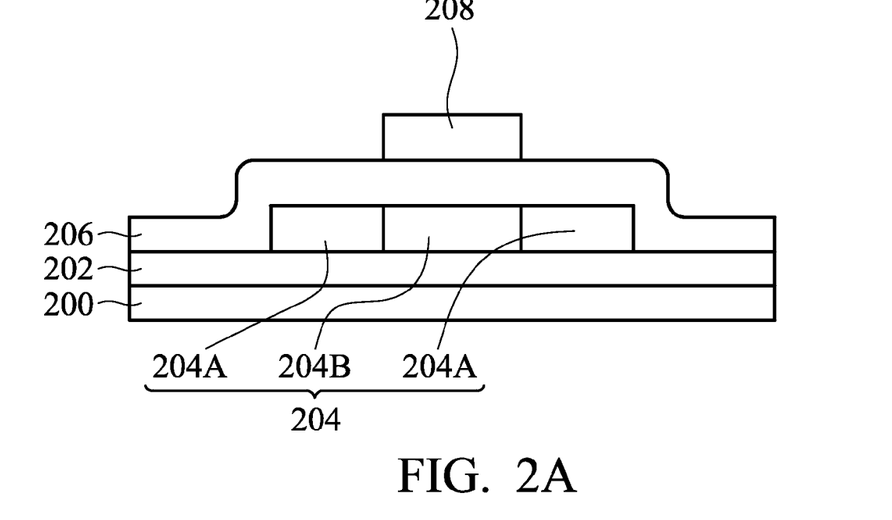
FIGS. 2A-2D are schematic cross-sectional views showing a method for fabricating an array substrate structure according to an embodiment of the invention.

In FIG. 2A, a substrate 200, for example a transparent substrate, is provided. A buffer layer 202 of dielectric materials such as silicon nitride, silicon oxide or combinations thereof is then formed over the substrate 200. Next, an active layer 204 is formed over a portion of the buffer layer 202 by sequential deposition and patterning of semiconductor materials such as amorphous silicon, polysilicon, or metal oxides. An insulating layer 206 of dielectric materials such as silicon oxide, silicon nitride, silicon oxynitride or hafnium oxynitride is then formed over substrate 200 and conformably covers the underlying buffer layer 202 and the active layer 204. Next, a patterned conductive layer 208 is formed by sequential deposition and patterning a layer of conductive material such as molybdenum (Mo) or aluminum (Al) over the substrate 200. The patterned conductive layer 208 is disposed over a portion of the active layer 204. Next, ion implantation (not shown) is performed on the substrate 200 to implant proper dopants into portions of active layer 204, using the conductive layer 208 as an implant mask. Thus, a pair of source/drain regions 204A doped with proper dopants and an undoped channel region 204B formed between the source/drain regions 204A are formed in active layer 204. The conductive layer 208 functions as a gate electrode of a thin film transistor.

Figure 2B:
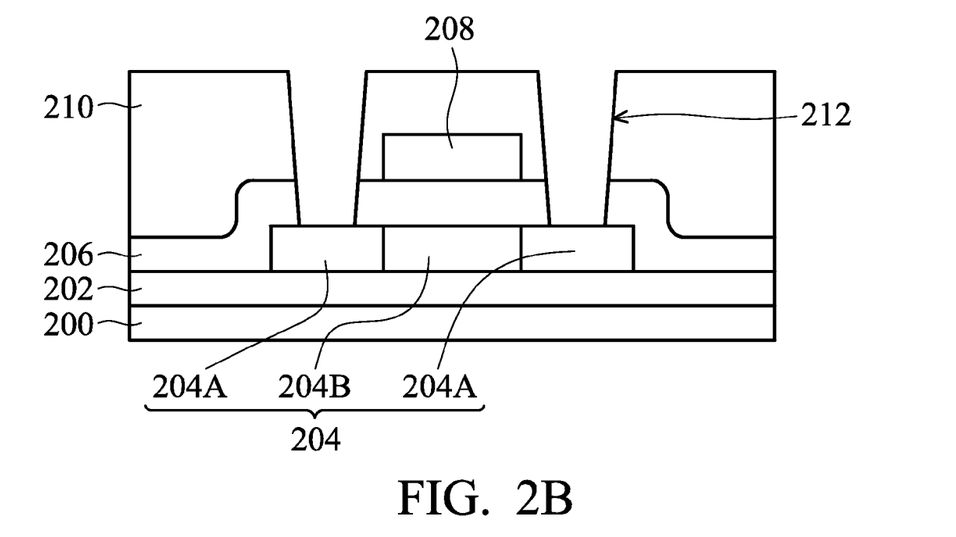

In FIG. 2B, an inter-layer dielectric (ILD) layer 210 of dielectric materials such as silicon oxide, silicon nitride, or silicon oxynitride is then formed over substrate 200 and patterned to form a plurality of openings 212 by an etching process such as dry etching with use of a suitable patterned mask. As shown in FIG. 2B, the openings 212 respectively penetrate a portion of the ILD layer 210 and the insulating layer 206 to expose a portion of a top surface of the source/drain regions 204A.

Figure 2C:
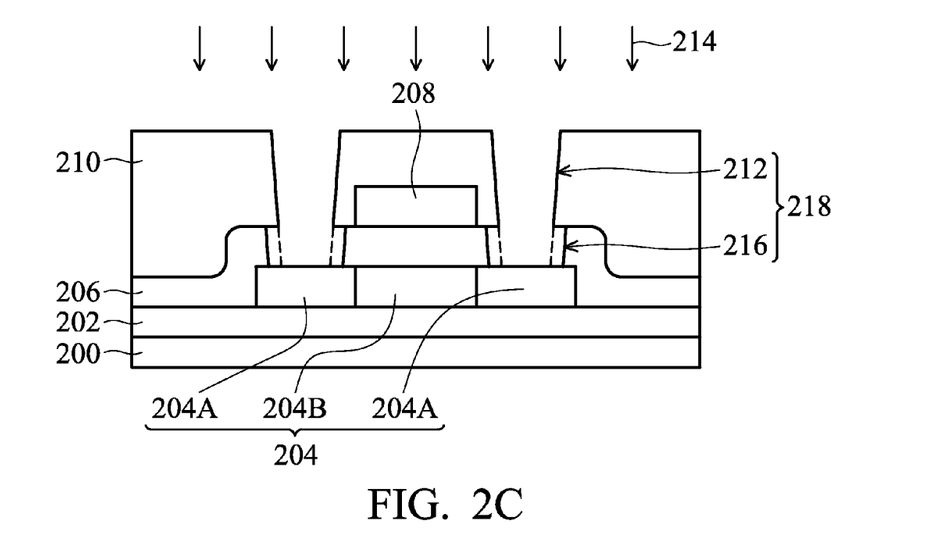

In FIG. 2C, an etching process 214 such as isotropical wet etching is then performed to selectively recess a portion of the insulating layer 206 exposed by the opening 212, thereby forming a recess 216 in a portion of the insulating layer 206 adjacent to the opening 212. The recess 216 is defined by a portion of a bottom surface of the ILD layer 210, a sidewall of the insulating layer 206, and a portion of a top surface of the source/drain region 204A of the active layer 204 in the opening 212. Therefore, the combination of the opening 212 and the recess 216 forms a contact opening 218, and the opening 212 is a main portion of the contact opening 218, and the recess 216 is a recess portion of the contact opening 218. In one embodiment, the insulating layer 206 comprises silicon oxide, and the ILD layer 210 comprises silicon nitride, such that the silicon oxide and the silicon nitride may have an etching selectivity of about 2:1-8:1 therebetween, and over-etching that may change the profile of the ILD layer 210 can be thus prevented during formation of the recess 216.

Figure 2D:
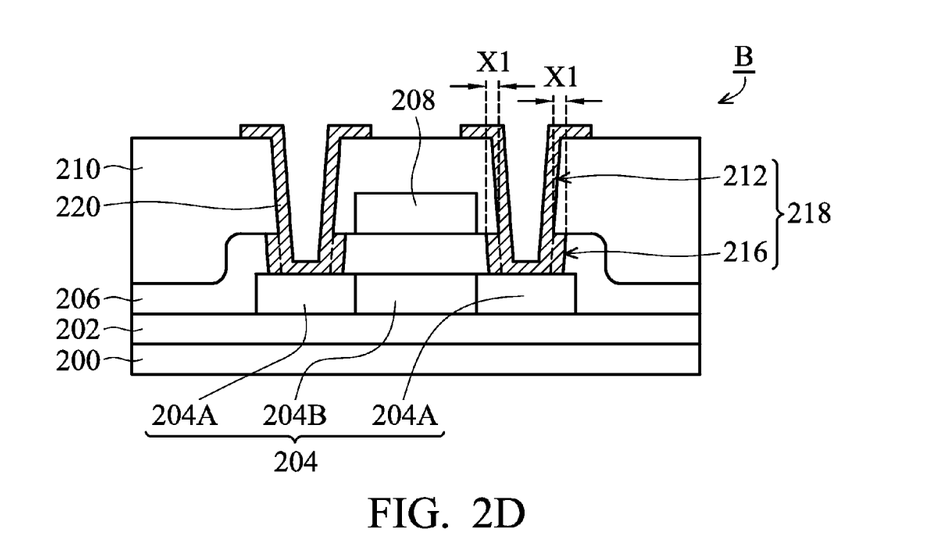

In FIG. 2D, a layer of conductive material is formed over the structure shown in FIG. 2C and then patterned to form a conductive layer 220 over a portion of a top surface of the ILD layer 210 and surfaces of the ILD layer 210, the insulating layer 206, and the active layer 204 exposed by the contact opening 218. The conductive layer 220 is also conformably formed in the recess 216 and covers the surfaces of the ILD layer 210, the insulating layer 206, and the source/drain region 204A exposed by the recess 216 to function as a conductive contact for a sequentially formed electrical element (not shown). The conductive layer 220 can be a single conductive layer or a multiple conductive layer such as a Mo—Al—Mo trilayer. In other embodiments, the conductive layer 220 may comprise the same material as that of the underlying conductive layer 208.

As shown in FIG. 2D, fabrication of the array substrate structure B is substantially completed. In one embodiment, a first distance X1 between a sidewall of the insulating layer 206 exposed by the recess 216 and a sidewall of the ILD layer 210 exposed by the opening 212 is about 0.05-0.5 μm. A plurality of recesses 216 additionally formed in the contact opening 218 thereby allows additional formation of the conductive layer 220 in these recesses 216. Therefore, the portions of the conductive layer 220 formed in the recesses 216 increase physically contacting regions between the conductive layer 220 and the source/drain regions 204A of the active layer 204. Thus, contact resistance between the conductive contact (i.e. the conductive layer 220) and the source/drain regions 204A of the TFT can be maintained or even reduced as the trend of size reduction of the elements such as TFTs and conductive contacts (e.g. the conductive layer 220) formed over the array substrate structure B continues, thereby maintaining or even improving related electrical performance of the array substrate structure B.

Figure 3A:
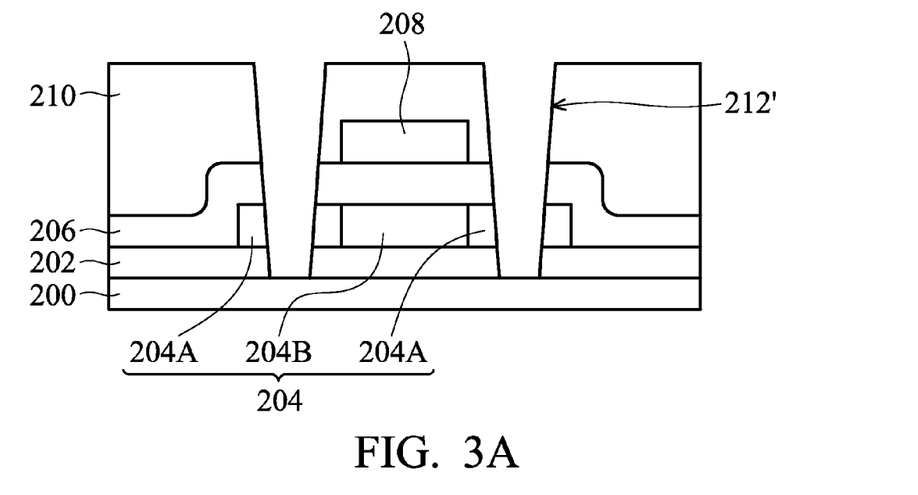
FIGS. 3A-3C are schematic cross-sectional views showing a method for fabricating an array substrate structure according to another embodiment of the invention.
Figure 3B:
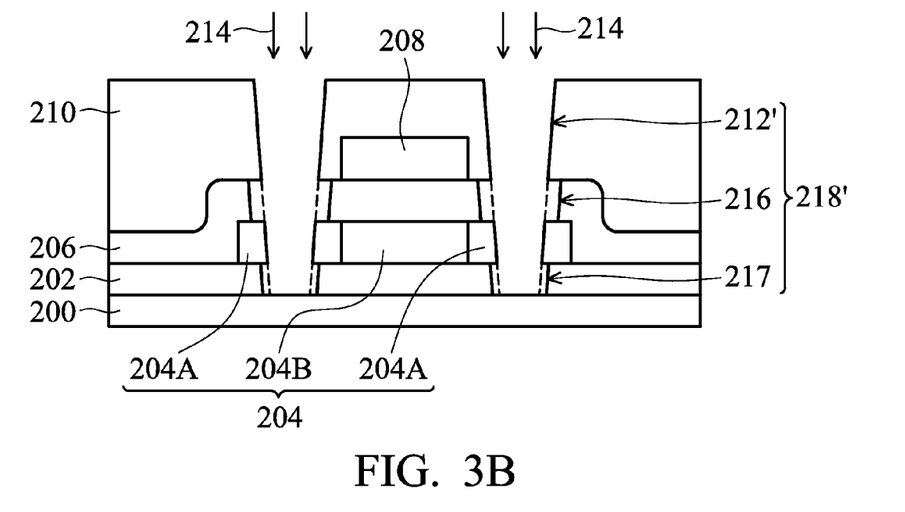
Figure 3C:
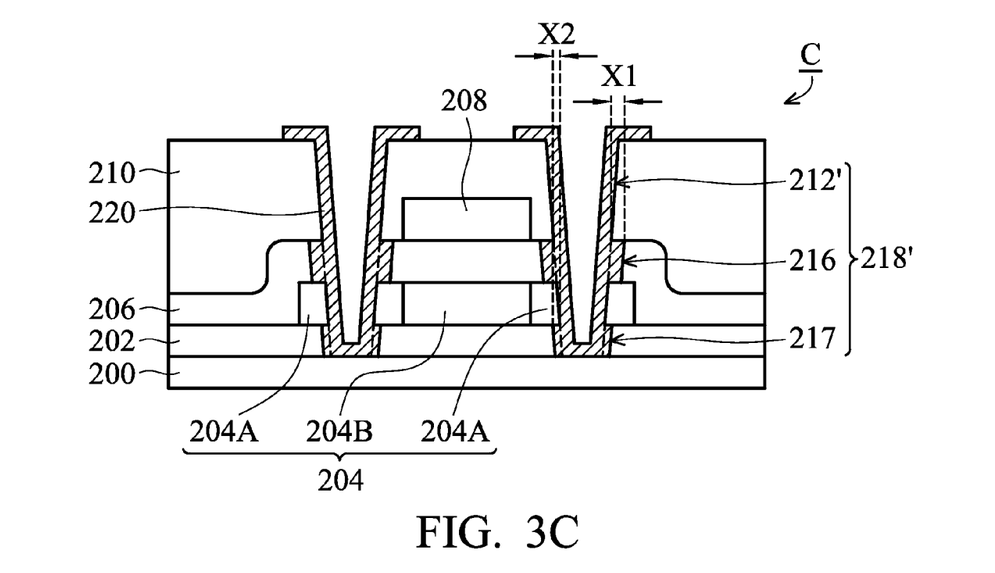

In addition, FIGS. 3A-3C are schematic cross-sectional views showing another exemplary method for fabricating an array substrate structure C. The fabrication method shown in FIGS. 3A-3C is modified from the fabrication method shown in FIGS. 2A-2D. Thus, for the purpose of brevity, only differences between these methods are described as below, and the same reference numbers in FIGS. 3A-3C represent the same components.

In FIG. 3A, the structure shown in FIG. 2B is provided first, and unlike the process shown in FIG. 2B, during an etching process such as dry etching for penetrating the ILD layer 210 and the insulating layer 206, a portion of the source/drain region 204A in the active region 204 and a portion of the underlying buffer layer 202 are further etched and penetrated and the etching process stops on the substrate 200, thereby forming an opening 212' penetrating a portion of the ILD layer 210, the insulating layer 206, the source/drain region 204a and the buffer layer 202 from top to bottom, as shown in FIG. 3a.

In FIG. 3B, an etching process 214 such as isotropical wet etching the same as that shown in FIG. 2C is then performed to selectively recess a portion of the insulating layer 206 and the buffer layer 202 exposed by the opening 212', thereby forming a recess 216 in a portion of the insulating layer 206 adjacent to the opening 212' and another recess 217 in a portion of the buffer layer 202 adjacent to the opening 212'. Herein, the recess 216 is defined by a portion of a bottom surface of the ILD layer 210, a sidewall of the insulating layer 206, and a portion of a top surface of the source/drain region 204A of the active layer 204 in the opening 212', and the recess 217 is defined by a portion of the bottom surface of the active layer 204, a sidewall of the buffer layer 202, and a portion of the top surface of the substrate in the opening 212'. Therefore, the combination of the opening 212' and the recesses 216 and 217 forms a contact opening 218', and the opening 212' is a main portion of the contact opening 218', and the recesses 216 and 217 are recess portions of the contact opening 218'. In one embodiment, the buffer layer 202 and the insulating layer 206 comprise silicon oxide, and the ILD layer 210 comprises silicon nitride, such that these three layers may have an etching selectivity of about 2:2:1-8:8:1 therebetween (buffer layer 202: insulating layer 206: ILD layer 210), and over-etching that may change a profile of the ILD layer 210 can be thus prevented during formation of the recesses 216 and 217.

In FIG. 3C, a layer of conductive material is formed over the structure shown in FIG. 3B and then patterned to form a conductive layer 220 over a portion of a top surface of the ILD layer 210 and surfaces of the ILD layer 210, the insulating layer 206, the active layer 204, the buffer layer 202 and the substrate 200 exposed by the contact opening 218'. The conductive layer 220 is also conformably formed in the recesses 216 and 217, and covers the surfaces of the ILD layer 210, the insulating layer 206, and the source/drain region 204A exposed by the recess 216 and the surfaces of the source/drain region 204A, the buffer layer 202 and the substrate 200 exposed by the recess 217 to function as a conductive contact for a sequentially formed electrical element (not shown). The conductive layer 220 can be a single conductive layer or a multiple conductive layer such as a Mo—Al—Mo trilayer. In other embodiments, the conductive layer 220 may comprise the same material as that of the underlying conductive layer 208.

As shown in FIG. 3C, fabrication of the array substrate structure C is substantially completed. In one embodiment, a first distance X1 between a sidewall of the insulating layer 206 exposed by the recess 216 and a sidewall of the ILD layer 210 exposed by the opening 212' is about 0.05-0.5 μm, and a second distance X2 between a sidewall of the buffer layer 202 exposed by the recess 217 and a sidewall of the ILD layer 210 exposed by the opening 212' is about 0.01-0.5 μm, and the first distance X1 is greater than the second distance X2. Due to a plurality of recesses 216 and 217 additionally formed in the contact opening 218', such that the conductive layer 220 is additionally formed in these recesses 216 and 217. Therefore, the portions of the conductive layer 220 formed in the recesses 216 and 217 increase physically contacting regions between the conductive layer 220 and the source/drain regions 204A of the active layer 204. Thus, a contact resistance between the conductive contact (i.e. the conductive layer 220) and the source/drain regions 204A of the TFT can be maintained or even reduced as the trend of size reduction of the elements such as TFTs and conductive contacts (e.g. the conductive layer 220) formed over the array substrate structure C continues, thereby maintaining or even improving related electrical performance of the array substrate structure C.

In the array substrate structure B shown in FIG. 2D and the array substrate structure C shown in FIG. 3C, the thin film transistors are illustrated as a top-gate type TFT. However, the contact opening used in the array substrate structure B shown in FIG. 2D and the array substrate structure C shown in FIG. 3C can be also used in the fabrication process for forming an array substrate structure with a bottom-gate type TFT, such that the scope of the invention is not limited by the array substrate structure B shown in FIG. 2D or the array substrate structure C shown in FIG. 3C.

FIGS. 4A-4D are schematic cross-sectional views showing yet another method for fabricating an array substrate structure D.

Figure 4A:
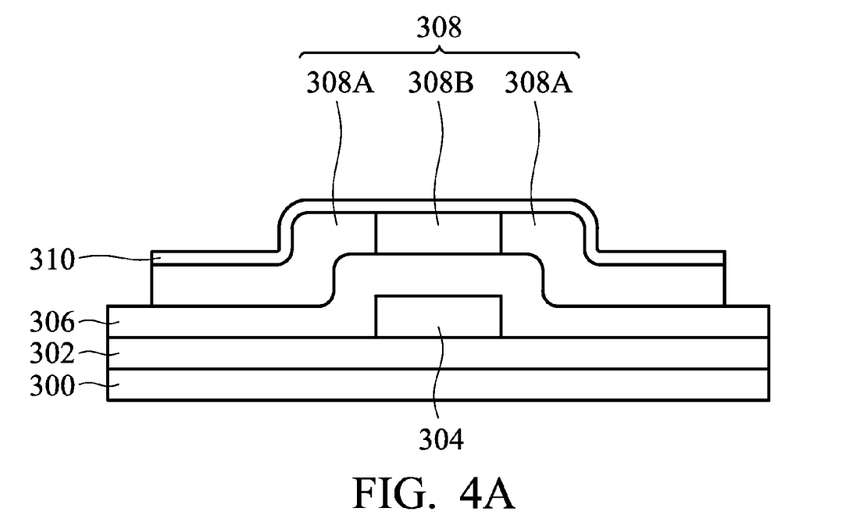
FIGS. 4A-4D are schematic cross-sectional views showing a method for fabricating an array substrate structure according to yet another embodiment of the invention.

In FIG. 4A, a substrate 300, for example a transparent substrate, is provided. A buffer layer 302, for example a layer of silicon nitride, silicon oxide or combinations thereof, is then formed over the substrate 300. Next, a patterned conductive layer 304 is formed by sequential deposition and patterning a layer of conductive material such as molybdenum (Mo) or aluminum (Al) over the buffer layer 302. Next, an insulating layer 306 of dielectric material such as silicon oxide, silicon nitride, silicon oxynitride or hafnium oxynitride is formed to conformably cover the underlying buffer layer 302 and the conductive layer 304. Next, an active layer 308 and an inter-layer dielectric (ILD) layer 310 are sequentially formed over a portion of the insulating layer 306 by sequential deposition and patterning of, for example, a layer of semiconductor material of amorphous silicon, polysilicon, or metal oxides, and a layer of dielectric material. The active layer 308 and the ILD layer 310 are formed over the conductive layer 304. The ILD layer may comprise dielectric materials such as silicon oxide, silicon nitride, or silicon oxynitride. Next, an ion implantation (not shown) with a proper implant mask (not shown) is performed to substrate 300 to implant proper dopants into portions of the active layer 308. Thus, a pair of source/drain regions 308A doped with proper dopants and an undoped channel region 308B formed between the source/drain regions 308A are formed in the active layer 308. Herein, a thin-film transistor is substantially fabricated, and the conductive layer 304 may function as a gate electrode of a thin film transistor.

Figure 4B:
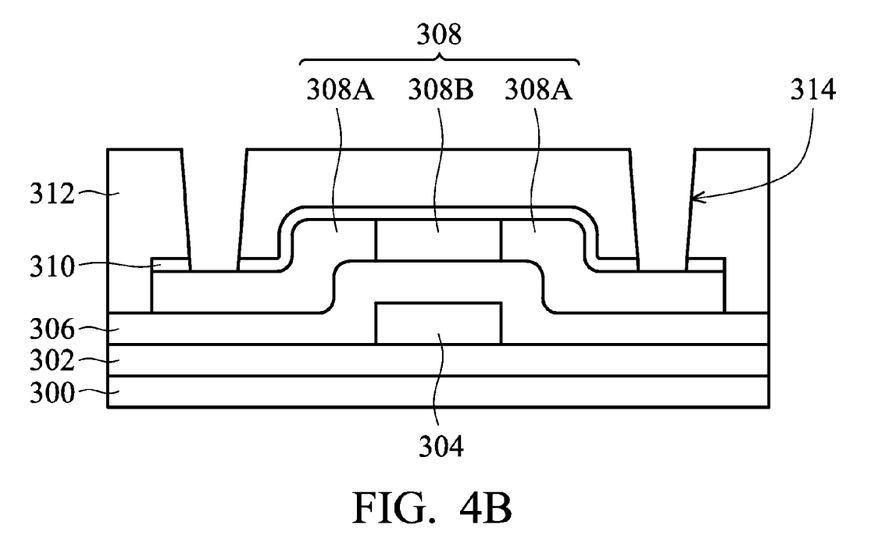

In FIG. 4B, an inter-layer dielectric (ILD) layer 312 comprising dielectric materials such as silicon oxide, silicon nitride, or silicon oxynitride is then formed over substrate 300 and patterned to form a plurality of openings 314 by an etching process such as dry etching with use of a suitable patterned mask. As shown in FIG. 4B, the openings 314 penetrate a portion of the ILD layer 312 and the ILD layer 310, respectively, to expose a portion of a top surface of the source/drain regions 308A.

Figure 4C:
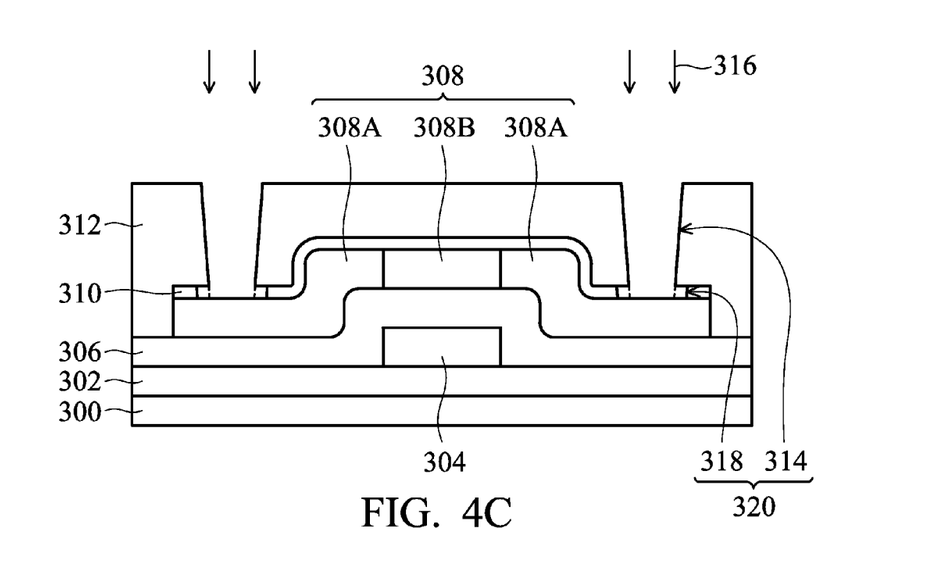

In FIG. 4C, an etching process 316 such as isotropical wet etching is then performed to selectively etch a portion of the ILD layer 310 exposed by the opening 314, thereby forming a recess 318 in a portion of the ILD layer 310 adjacent to the opening 314. The recess 318 is defined by a portion of a bottom surface of the ILD layer 312, a sidewall of the ILD layer 310, and a portion of a top surface of the source/drain region 308A of the active layer 308 in the opening 314. Therefore, the combination of the opening 314 and the recess 318 forms a contact opening 320, and the opening 314 is a main portion of the contact opening 320, and the recess 318 is a recess portion of the contact opening 320. In one embodiment, the ILD layer 310 comprises silicon oxide, and the ILD layer 312 comprises silicon nitride, such that the silicon oxide and the silicon nitride may have an etching selectivity of about 2:1-8:1 therebetween, and over-etching that may change the profile of the ILD layer 312 can be thus prevented during formation of the recess 318.

Figure 4D:
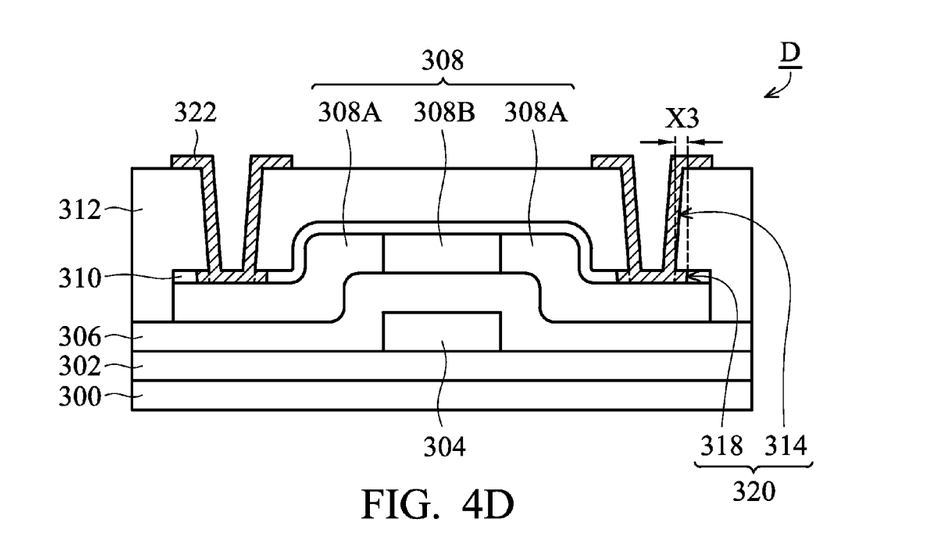

In FIG. 4D, a layer conductive material is formed over the structure shown in FIG. 4C, and is then patterned to form a conductive layer 322 over a portion of the ILD layer 312 and surfaces of the ILD layer 312, the ILD layer 310 and the active layer 308 exposed by the contact opening 320. The conductive layer 322 is also conformably formed in the recess 318 and covers the exposed surfaces of the ILD layer 312, the ILD layer 310, and the source/drain region 308A exposed by the recess 318 to function as a conductive contact for a sequentially formed electrical element (not shown). The conductive layer 322 can be a single conductive layer or a multiple conductive layer such as a Mo—Al—Mo trilayer. In other embodiments, the conductive layer 322 can comprise the same material as that of the underlying conductive layer 304.

As shown in FIG. 4D, fabrication of the array substrate structure D is substantially completed. In one embodiment, a first distance X3 between a sidewall of the ILD layer 310 exposed by the recess 318 and a sidewall of the ILD layer 312 exposed by the opening 314 is about 0.05-0.5 μm. A plurality of recesses 318 additionally formed in the contact opening 320 allows additional formation of the conductive layer 322 in these recesses 318. Therefore, the portion of the conductive layer 322 formed in the recesses 318 may increase physical contact regions between the conductive layer 322 and the source/drain regions 308A of the active layer 308, and the contact resistance between the conductive contact (i.e. the conductive layer 322) and the source/drain region 308A of the TFT can be maintained or even reduced as the trend of size reduction of the elements such as TFTs and conductive contacts (e.g. the conductive layer) formed over the array substrate structure D continues, thereby maintaining or even improving related electrical performance of the array substrate structure D.

Figure 5A:
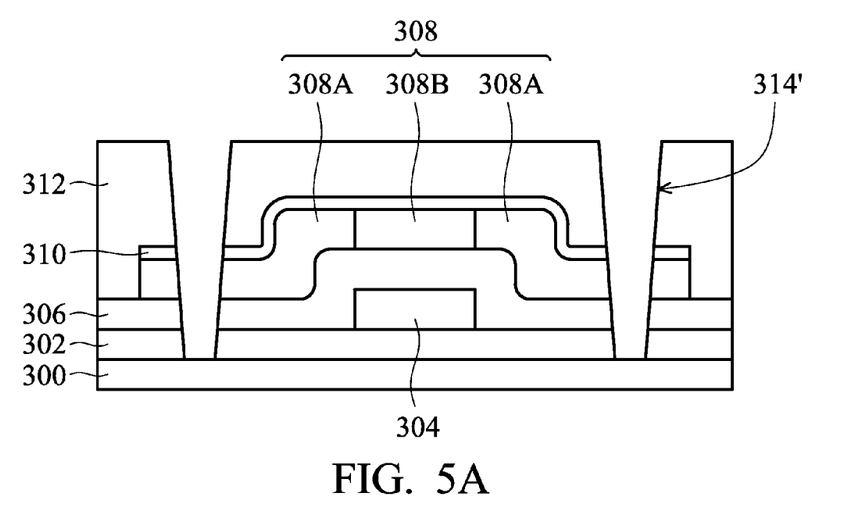
FIGS. 5A-5C are schematic cross-sectional views showing a method for fabricating an array substrate according to another embodiment of the invention.
Figure 5B:
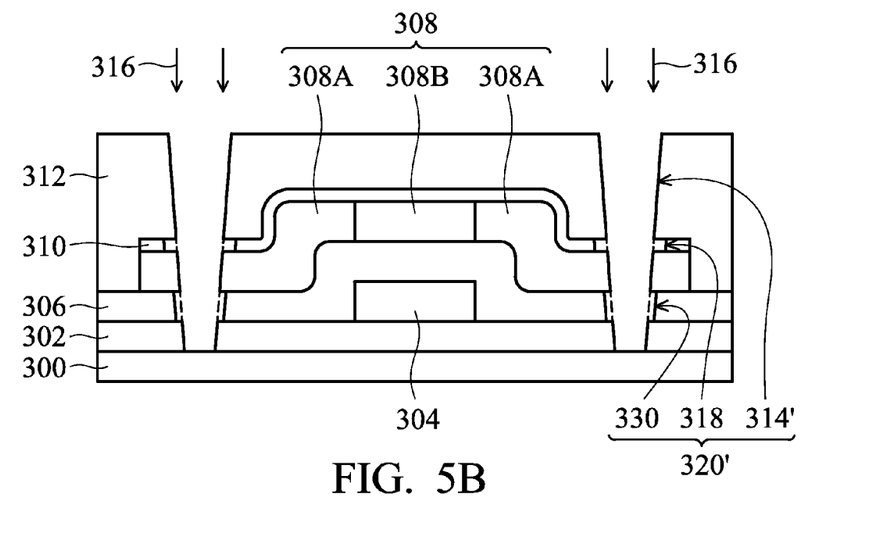
Figure 5C:
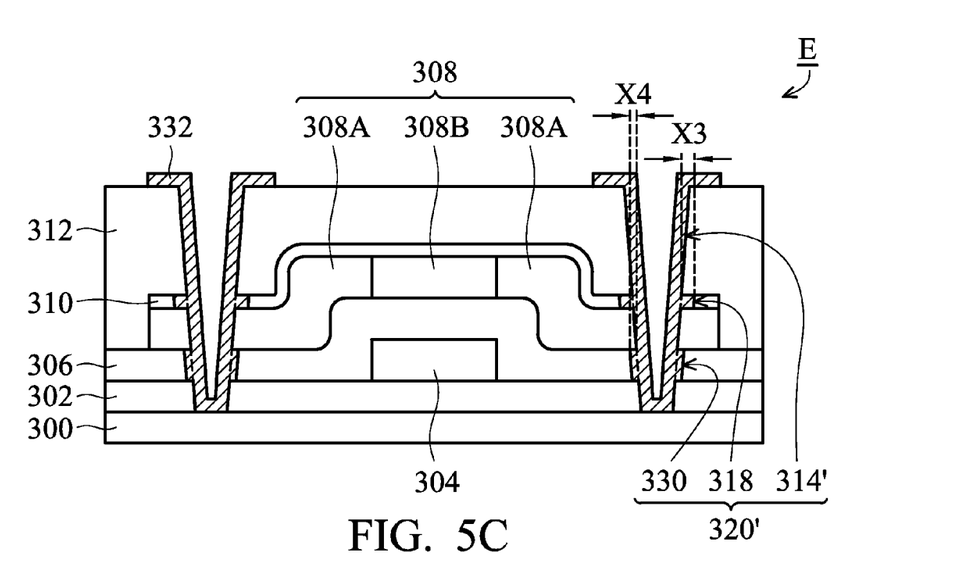

In addition, FIGS. 5A-5C are schematic cross-sectional views showing another exemplary method for fabricating an array substrate structure E. The fabrication method shown in FIGS. 5A-5C is modified from the fabrication method shown in FIGS. 4A-4D. Thus, for the purpose of brevity, only the differences between these methods are described as below, and the same reference numbers in FIGS. 5A-5C represent the same components.

In FIG. 5A, the structure shown in FIG. 4B is first provided, and unlike the process shown in FIG. 4B, during an etching process such as dry etching for penetrating the ILD layer 312 and the ILD layer 310, a portion of the source/drain region 308A in the active region 308 and a portion of the underlying insulating layer 306 and buffer layer 302 are further etched and penetrated, and the etching process stops on the substrate 300, thereby forming an opening 314' penetrating a portion of the ILD layer 312, the ILD layer 310, the source/drain region 308A, the insulating layer 306, and the buffer layer 302 from top to bottom, as shown in FIG. 5A.

In FIG. 5B, an etching process 316 such as isotropical wet etching the same as that shown in FIG. 4C is then performed to selectively recess a portion of the ILD layer 310 and the insulating layer 306 exposed by the opening 314', thereby forming a recess 318 in a portion of the ILD layer 310 adjacent to the opening 314' and another recess 330 in a portion of the insulating layer 306 adjacent to the opening 314'. Herein, the recess 318 is defined by a portion of a bottom surface of the ILD layer 312, a sidewall of the ILD layer 310, and a portion of a top surface of the source/drain region 308A of the active layer 308 in the opening 314', and the recess 330 is defined by a portion of a bottom surface of the active layer 308, a sidewall of the insulating layer 306, and a portion of a top surface of the buffer layer 302 in the opening 314'. Therefore, the combination of the opening 314' and the recesses 318 and 330 forms a contact opening 320', and the opening 314' is a main portion of the contact opening 320', and the recesses 318 and 330 are recess portions of the contact opening 320'. In one embodiment, the ILD layer 310 and the insulating layer 306 comprise silicon oxide, and the ILD layer 312 comprises silicon nitride, such that these three layers may have an etching selectivity of about 2:2:1-8:8:1 therebetween (ILD layer 310: insulating layer 306: ILD layer 312), and over-etching that may change a profile of the ILD layer 312 can be thus prevented during formation of the recesses 318 and 330.

In FIG. 5C, a layer of conductive material is formed over the structure shown in FIG. 5B and then patterned to form a conductive layer 332 over a portion of a top surface of the ILD layer 312 and surfaces of the ILD layer 312, the ILD layer 310, the active layer 308, the insulating layer 306, the buffer layer 302 and the substrate 300 exposed by the contact opening 320'. The conductive layer 332 is also conformably formed in the recesses 318 and 330, and covers the surfaces of the ILD layer 312, the ILD layer 310 and the source/drain region 308A exposed by the recess 318 and the surfaces of the source/drain region 308A, the insulating layer 306, the buffer layer 302 and the substrate 300 exposed by the recess 330 to function as a conductive contact for a sequentially formed electrical element (not shown). The conductive layer 332 can be a single conductive layer or a multiple conductive layer such as a Mo—Al—Mo trilayer. In other embodiments, the conductive layer 332 may comprise the same material as that of the underlying conductive layer 304.

As shown in FIG. 5C, fabrication of the array substrate structure E is substantially completed. In one embodiment, a first distance X3 between a sidewall of the ILD layer 310 exposed by the recess 318 and a sidewall of the ILD layer 312 exposed by the opening 314' is about 0.05-0.5 μm, and a second distance X4 between a sidewall of the insulating layer 306 exposed by the recess 330 and a sidewall of the ILD layer 312 exposed by the opening 314' is about 0.01-0.5 μm, and the first distance X3 is greater than the second distance X4. Due to a plurality of recesses 318 and 330 additionally formed in the contact opening 320', such that the conductive layer 332 is additionally formed in these recesses 318 and 330. Therefore, the portions of the conductive layer 332 formed in the recesses 318 and 330 increase physically contacting regions between the conductive layer 332 and the source/drain regions 308A of the active layer 308. Thus, a contact resistance between the conductive contact (i.e. the conductive layer 332) and the source/drain regions 308A of the TFT can be maintained or even reduced as the trend of size reduction of the elements such as TFTs and conductive contacts (e.g. the conductive layer 332) formed over the array substrate structure E continues, thereby maintaining or even improving related electrical performance of the array substrate structure E.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A contact structure comprising:
   a substrate;
   an active layer over the substrate;
   an insulating layer over the active layer;
   an inter-layer dielectric (ILD) layer over the insulating layer;
   a contact opening penetrating a portion of the ILD layer and the insulating layer, exposing a portion of the active layer, wherein the contact opening comprises a first recess portion, wherein the first recess portion is defined by a surface of the ILD layer, a sidewall of the insulating layer, and a top surface of the active layer, and wherein the surface of the ILD layer makes an angle with the sidewall of the insulating layer which is not equal to 180 degrees; and
   a conductive layer in the contact opening, electrically connected to the active layer.

2. The contact structure as claimed in claim 1, further comprising a buffer layer disposed between the substrate and the active layer, wherein the contact opening further penetrates a portion of the active layer and the buffer layer to expose a portion of the active layer, the buffer layer, and the substrate, wherein the contact opening further comprises a second recess portion, and the second recess portion is defined by a bottom surface of the active layer, a sidewall of the buffer layer, and a top surface of the substrate, and the conductive layer is disposed over the portion of the buffer layer exposed by the contact opening and the portion of the substrate exposed by the contact opening.

3. The contact structure as claimed in claim 2, wherein a distance between the sidewall of the insulating layer and the sidewall of the active layer exposed by the contact opening is a first distance, and a distance between the sidewall of the buffer layer and the sidewall of the active layer exposed by the contact opening is a second distance, and the first distance is greater than the second distance.

4. The contact structure as claimed in claim 3, wherein the first distance is about 0.05-0.5 μm, and the second distance is about 0.01-0.5 μm.

5. The contact structure as claimed in claim 1, wherein the active layer comprises semiconductor materials.

6. The contact structure as claimed in claim 1, wherein the angle is less than 180 degrees.

7. An array substrate structure comprising:
   a substrate;
   an active layer over a portion of the substrate;
   an insulating layer over the active layer;
   a first conductive layer over the insulating layer, being disposed over a portion of the active layer;
   an inter-layer dielectric (ILD) layer over the first conductive layer and the insulating layer;
   a contact opening penetrating a portion of the ILD layer and the insulating layer, exposing a portion of the active layer, wherein the contact opening comprises a first recess portion, wherein the first recess portion is defined by a surface of the ILD layer, a sidewall of the insulating layer and a top surface of the active layer, and wherein the sidewall of the ILD layer makes an angle with the sidewall of the insulating layer which is not equal to 180 degrees; and
   a second conductive layer in the contact opening, electrically connected to the active layer.

8. The array substrate structure as claimed in claim 7, further comprising a buffer layer disposed between the substrate and the active layer, wherein the contact opening further penetrates a portion of the active layer and the buffer layer to expose a portion of the active layer, the buffer layer, and the substrate, wherein the contact opening further comprises a second recess portion, and the second recess portion is defined by a bottom surface of the active layer, a sidewall of the buffer layer, and a top surface of the substrate, and the second conductive layer is disposed over the portion of the buffer layer exposed by the contact opening and the portion of the substrate exposed by the contact opening.

9. The array substrate structure as claimed in claim 8, wherein a distance between the sidewall of the insulating layer and the sidewall of the active layer exposed by the contact opening is a first distance, and a distance between the sidewall of the buffer layer and the sidewall of the active layer exposed by the contact opening is a second distance, and the first distance is greater than the second distance.

10. The array substrate structure as claimed in claim 9, wherein the first distance is about 0.05-0.5 μm, and the second distance is about 0.01-0.5 μm.

11. The array substrate structure as claimed in claim 7, wherein the active layer comprises semiconductor materials.

12. The array substrate structure as claimed in claim 8, wherein the angle is less than 180 degrees.

* * * * *